(12) United States Patent
Kim (10) Patent No.: US 8,133,790 B2
(45) Date of Patent: Mar. 13, 2012

(54) SEMICONDUCTOR DEVICE AND METHOD FOR FABRICATING THE SAME

(75) Inventor: Jong-Min Kim, Guro-gu (KR)

(73) Assignee: Dongbu HiTek Co., Ltd., Seoul (KR)

(*) Notice: Subject to any disclaimer, the term of this patent is extended or adjusted under 35 U.S.C. 154(b) by 239 days.

(21) Appl. No.: 12/643,014

(22) Filed: Dec. 21, 2009

(65) Prior Publication Data

US 2010/0163986 A1 Jul. 1, 2010

(30) Foreign Application Priority Data

Dec. 30, 2008 (KR) .................. 10-2008-0136741

(51) Int. Cl.
  *H01L 21/336* (2006.01)
  *H01L 29/02* (2006.01)
(52) U.S. Cl. .............. 438/289; 438/217; 257/402
(58) Field of Classification Search .......... 257/285–287, 257/402, 409; 438/217, 289

See application file for complete search history.

(56) References Cited

U.S. PATENT DOCUMENTS 7,598,569 B2 * 10/2009 Shindo et al. ............. 257/333

* cited by examiner

*Primary Examiner* — Calvin Lee
(74) *Attorney, Agent, or Firm* — Sherr & Vaughn, PLLC (57) ABSTRACT

A semiconductor device and a method of manufacturing a semiconductor device. A method may include forming a first well by injecting first conduction type impurity ions on and/or over a semiconductor substrate, forming an extended drain region overlapped with a region of said first well by injecting second conduction type impurities on and/or over a semiconductor substrate, and/or forming a first conduction type second well on and/or over a semiconductor substrate under an extended drain region to overlap with another region of a first well by injecting second conduction type impurities on and/or over a semiconductor substrate. A method may include forming a gate over a first well overlapped with an extended drain region, and/or forming a drain region by injecting second conduction type impurities on and/or over an extended drain region at one side of a gate.

14 Claims, 7 Drawing Sheets

SEMICONDUCTOR DEVICE AND METHOD FOR FABRICATING THE SAME

The present application claims priority under 35 U.S.C. 119 to Korean Patent Application No. 10-2008-0136741 (filed on Dec. 30, 2008) which is hereby incorporated by reference in its entirety.

BACKGROUND

Embodiments relate to semiconductor devices and methods thereof. Some embodiments relate to a high voltage semiconductor device and methods thereof.

Circuits may be used for Large Scale Integration (LSI), which may drive a flat display device, such as an LCD, PDP, OLED, may be in automobiles, in OA and/or peripheral devices, and/or may be used as a motor driving LSI. Therefore, markets for LSI technology may have expanded widely. Circuits which may be used for Large Scale Integration (LSI) may have a relatively high voltage device and/or a relatively low voltage logic device integrated within a chip. Power Management Integrated Circuit (PMIC) products may have a relatively high voltage device and/or a relatively low voltage logic device integrated within a chip, may be developed, and/or fields of application thereof may be increasing.

To fabricate a high voltage device, a well forming step may be performed and/or an extended drain region may be formed for a relatively high voltage device before a logic device may be formed. Steps to form a relatively high voltage device may cause a relative increase of fabrication steps, which may increase relative production cost. The use of a well for a logic device together with a well for a relatively high voltage device at a single device channel region may cause relative instability of a device threshold voltage. The integration of a relative high voltage device and/or a relative low voltage logic device at one chip may make it relatively difficult to manufacture a relatively smaller device. Accordingly, there is a need of a high voltage semiconductor device and methods thereof.

SUMMARY

Embodiments relate to a high voltage semiconductor device and methods thereof. According to embodiments, a high voltage device and a method of manufacturing the same may include a light concentration well type. In embodiments, a light concentration well region and/or a light concentration extended drain region may be formed at a drain region of a logic device locally by having a step.

According to embodiments, a method of manufacturing a semiconductor device may include forming a first well by injecting first conduction type impurity ions on and/or over a semiconductor substrate. In embodiments, a method of manufacturing a semiconductor device may include forming an extended drain overlapped with a region of a first well by injecting second conduction type impurities on and/or over a semiconductor substrate. In embodiments, a method of manufacturing a semiconductor device may include forming a first conduction type second well on and/or over a semiconductor substrate under an extended drain, which may overlap with another region of a first well by injecting second conduction type impurities on and/or over a semiconductor substrate. In embodiments, a method of manufacturing a semiconductor device may include forming a gate over a first well overlapped with an extended drain. In embodiments, a method of manufacturing a semiconductor device may include forming a drain region by injecting second conduction type impurities on and/or over an extended drain region at one side of a gate.

According to embodiments, a semiconductor device may include a conduction type first well on and/or over a semiconductor substrate. In embodiments, a semiconductor device may include an extended drain overlapped with a region of a first well. In embodiments, a semiconductor device may include a first conduction type second well overlapped with another region of a first well. In embodiments, a semiconductor device may include a gate on and/or over a first well overlapped with an extended drain partly. In embodiments, a semiconductor device may include a drain region formed by injecting second conduction type impurities on and/or over an extended drain region at one side of a gate.

DRAWINGS

Example

Example

Example

Example

Example

DESCRIPTION

Figure 1A:
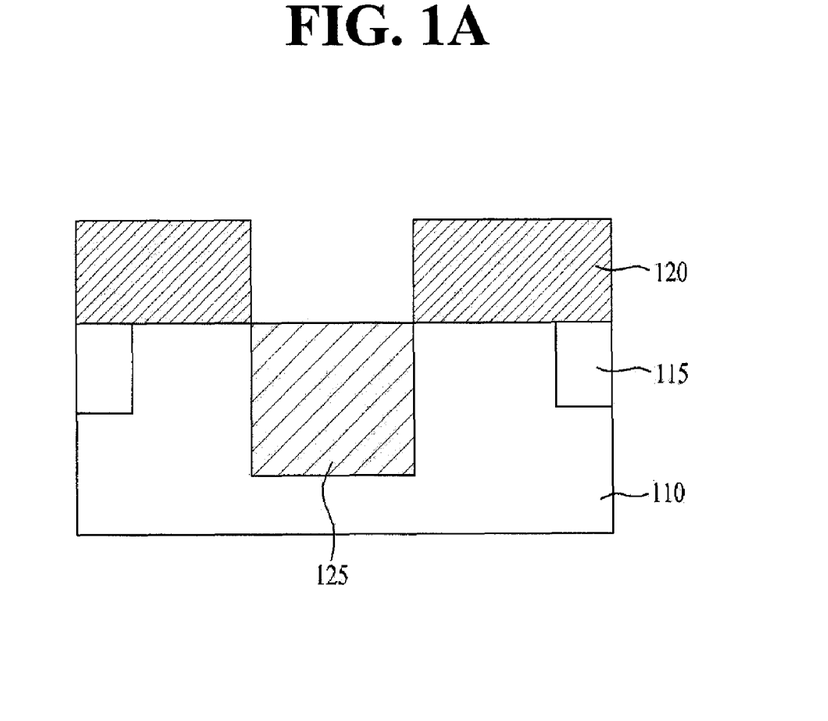
FIG. 1A to FIG. 1D are section views illustration a method of manufacturing a semiconductor device in accordance with embodiments.

Embodiments relate to a high voltage semiconductor device and methods thereof. Example FIG. 1A to FIG. 1D illustrate a method of manufacturing a semiconductor device in accordance with embodiments. Referring to FIG. 1A, semiconductor substrate 110 may include device isolation film 115. According to embodiments, device isolation film 115 may be formed by Shallow Trench Isolation (STI) and/or Local Oxidation of Silicon (LOCOS). In embodiments, a device isolation film may define semiconductor substrate 110 into a device isolation region and/or an active region. In embodiments, a semiconductor substrate may include a silicon substrate. In embodiments, first conduction type and/or second conduction type impurities may be injected on and/or over semiconductor substrate 110, for example at an impurity concentration of approximately 5E16 atoms/cm$^2$.

According to embodiments, first conduction type impurity ions may be injected on and/or over an active region of semiconductor substrate 110 locally, which may form first well 125. In embodiments, semiconductor substrate 110 may be subjected to photolithography to form first photoresist pattern 120, which may expose a portion of a semiconductor substrate. In embodiments, first conduction type impurities may be injected on and/or over semiconductor substrate 110 exposed, for example at a concentration between approximately 5E16 atoms/cm$^2$ and 1E18 atoms/cm$^2$ using first photoresist pattern 120 as a mask, which may form first well 125. In embodiments, first well 125 may be formed using multiple ion injection, for example, well ion injection, punchthrough stop ion injection and/or threshold voltage controlling ion injection. In embodiments, first well 125 may have a shape of a retrograde well and/or a diffused well.

Figure 1B:
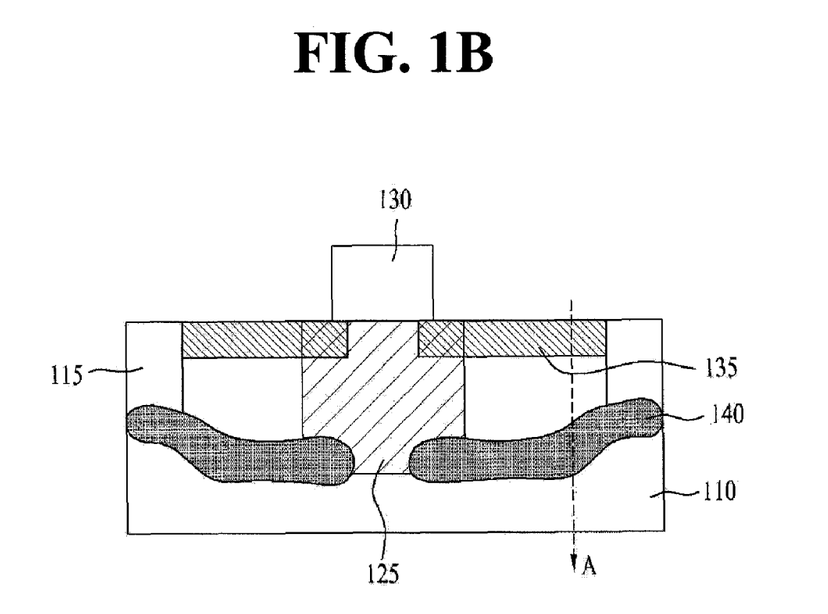

Referring to FIG. 1B, first photoresist pattern 120 may be substantially removed by ashing and/or stripping. According to embodiments, second conduction type impurities may be injected on and/or over semiconductor substrate 110 having first well 125, which may form extended drain 135 overlapped with a portion of first well 125, and/or first conduction type second well 140 overlapped with another region of first well 125. In embodiments, second well 140 may be formed under extended drain 135. In embodiments, concentration of impurities injected on and/or over an extended drain may be between approximately 1E17 atoms/cm$^2$ and 5E18 atoms/cm$^2$.

According to embodiments, second photoresist pattern 130 may be formed to cover a region, for example a central region, of first well 125. In embodiments, a first implanting step may be performed to inject second conduction type impurities on and/or over a peripheral region of first well region 125 exposed by second photoresist pattern 130, excluding a central region, and/or semiconductor substrate 110, which may form extended drain 135 overlapped with one region of first well 125. In embodiments, extended drain 135 may be formed to overlap at an upper side opposite peripheral regions of the first well 125. In embodiments, for example in a first implanting step, a tilted ion injection of second conduction type impurities may be made to form extended drain 135 overlapped with one region of first well 125.

According to embodiments, a second implanting step may be performed to inject second conduction type impurities using second photoresist pattern 130 as a mask, which may form first conduction type second well 140 on and/or over semiconductor substrate under extended drain 135, overlapped with another region of first well 125. In embodiments, second well 140 may be formed to overlap with opposite peripheral regions of a lower portion of first well 125, and/or to extend to a lower portion of device isolation film 115. In embodiments, a light concentration doping region may be formed between extended drain 135 and/or second well 140. In embodiments, a relatively high breakdown voltage may be formed. In embodiments, insulation between devices may be possible. In embodiments, a depth of Range of Projection (RP) may be between approximately 0.3 μm and 2.0 μm from a surface of semiconductor substrate 110, for example depending on a designed breakdown voltage and/or a depth of device isolation film 115.

Figure 1C:
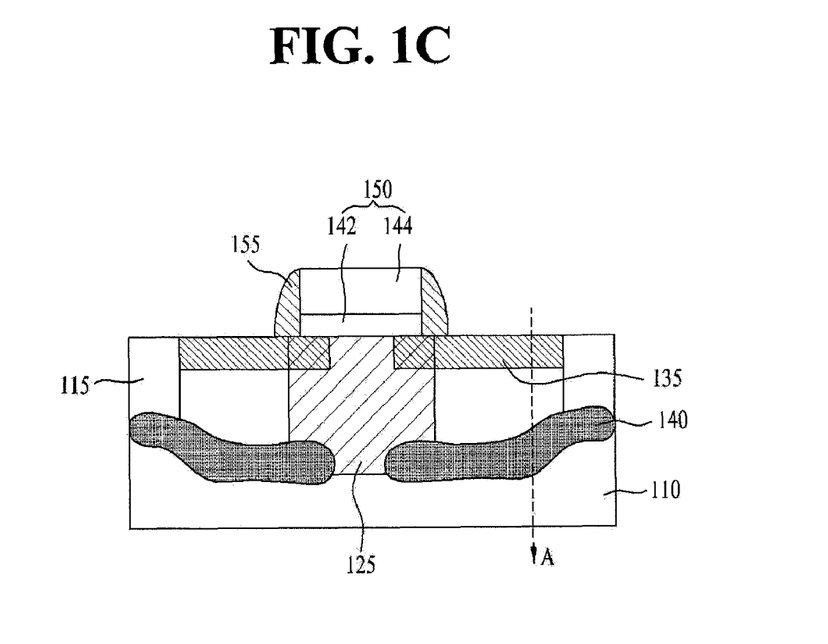

Referring to FIG. 1C, second photoresist pattern 130 may be substantially removed. According to embodiments, gate 150 may include a stack of gate insulating film 142 and/or gate electrode 144 which may be formed on and/or over first well 125 overlapped with extended drain 135. In embodiments, gate 150 may be formed such that first well 125 and a region where extended drain 135 and first well 125 overlap may be positioned under gate 150. In embodiments, spacer 155 may be formed at a sidewall of gate 150. In embodiments, spacers 155 may be formed extended to upper edges of first well 125.

Figure 1D:
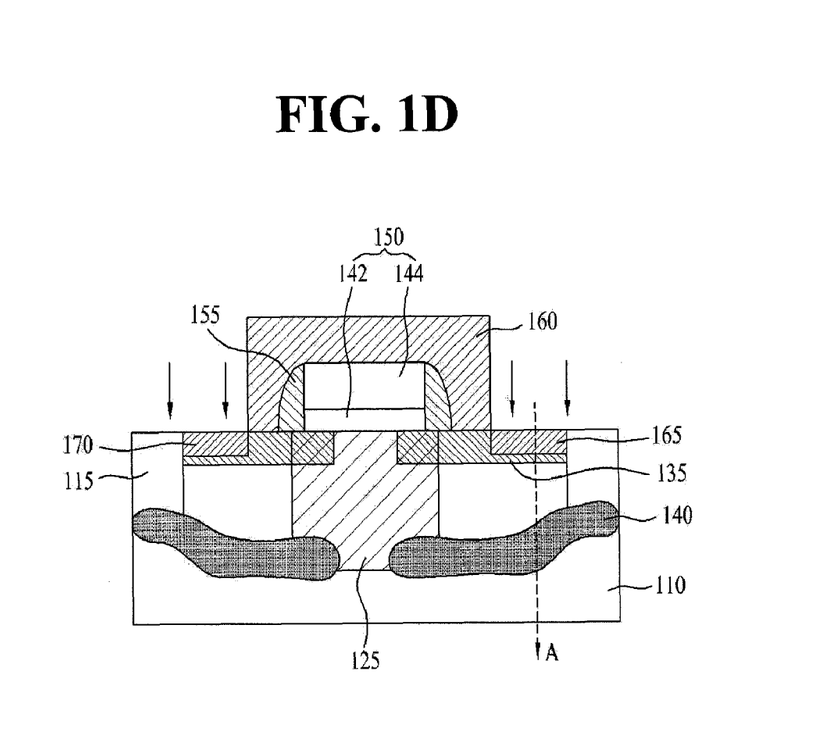

Referring to FIG. 1D, second conduction type impurities may be injected on and/or over extended drain region 135, for example at one side of gate 150, which may form drain region 165. According to embodiments, second conduction type impurities may be injected on and/or over extended drain region 135 at another side of gate 150, which may form source region 170. In embodiments, to adjust a breakdown voltage of a relatively high voltage device, lightly doped extended drain region 135 may be formed between a channel region under gate 150 and drain region 165, for example by forming drain region 165 spaced apart from gate 150.

According to embodiments, a breakdown voltage characteristic and/or a hot carrier characteristic of a high voltage semiconductor device may be controlled by a width of a region where extended drain region 135 and first well overlap and/or a width of lightly doped extended drain region 135 between a channel region under gate 150 and drain region 165. In embodiments, increasing a width of a region where extended drain region 135 and first well overlap and/or a width of lightly doped extended drain region 135 between channel region under gate 150 and drain region 165 may maximize a breakdown voltage.

Figure 2A:
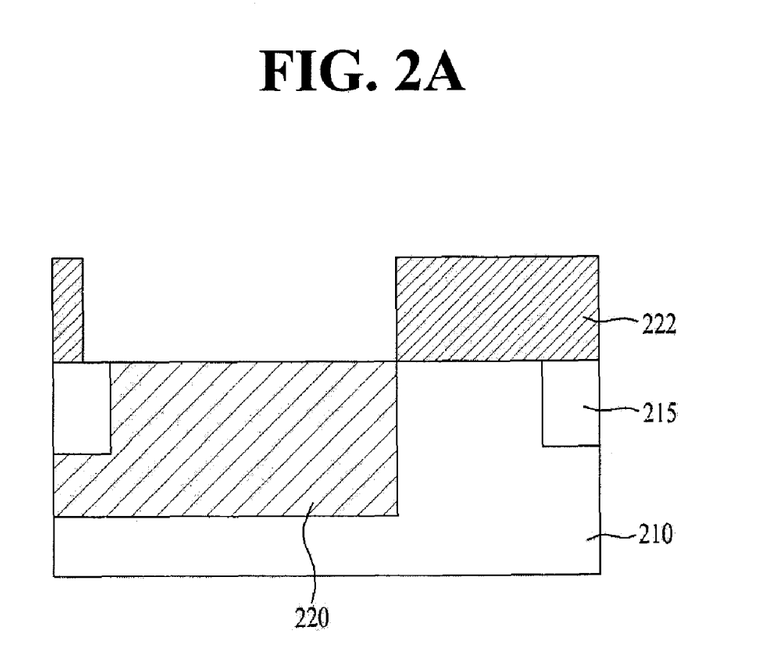
FIG. 2A to 2D are section views illustrating a method of manufacturing a semiconductor device in accordance with embodiments.

Embodiments relate to a high voltage semiconductor device and methods thereof. Referring to example FIG. 2A to FIG. 2D, section views illustrate a method of manufacturing a semiconductor device in accordance with embodiments. Referring to FIG. 2A, first well 220 may be formed by injecting first conduction type impurities on and/or over semiconductor substrate 210, which may include device isolation film 215. In embodiments, first photoresist pattern 222 may be formed on and/or over semiconductor substrate 210, which may expose device isolation film 215 and/or a portion of semiconductor substrate 210. In embodiments, first conduction type impurities may be injected on and/or over a portion of semiconductor substrate 110 exposed, for example at a concentration between approximately 5E16 atoms/cm2 and 1E18 atoms/cm2, using first photoresist pattern 222 as a mask, which may form first well 220 in contact with device isolation film 215.

Figure 2B:
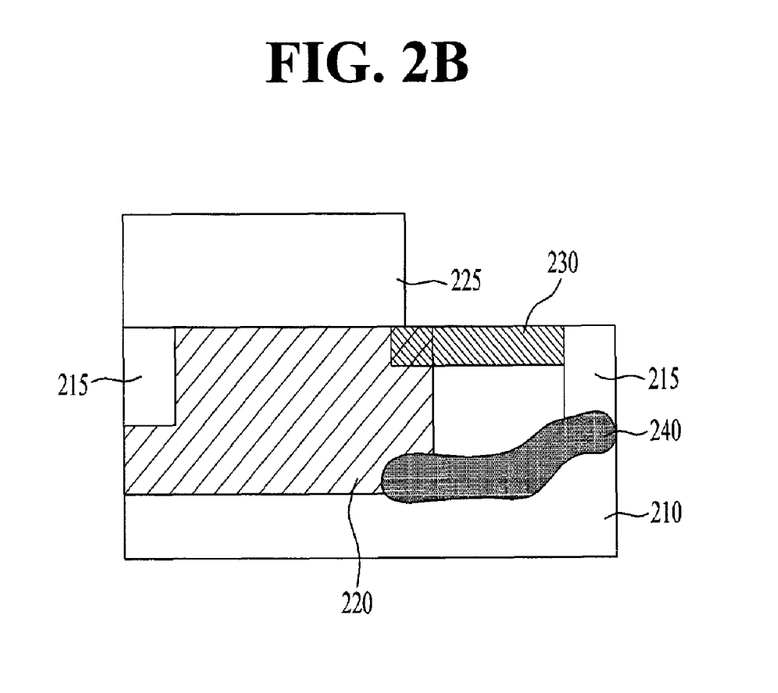

Referring to FIG. 2B, first photoresist pattern 222 may be substantially removed by ashing and/or stripping. In embodiments, extended drain region 230 may be formed on and/or over a surface of semiconductor substrate 210, which may overlap with one side and/or an upper side of a peripheral region of first well 220. In embodiments, a first implanting step may be performed in which second photoresist pattern 225 may be formed. In embodiments, second photoresist pattern 225 may cover device isolation film 215 and/or a portion of first well 220, and/or may expose a peripheral region of first well 220. In embodiments, second conduction type impurities may be injected on and/or over an upper peripheral region of first well 220 and/or semiconductor substrate 210 adjacent thereto using second photoresist pattern 225 as a mask, for example at a concentration between approximately 1E17 atoms/cm$^2$ and 5E18 atoms/cm$^2$, which may form extended drain region 230. In embodiments, second conduction type impurities may be injected on and/or over semiconductor substrate using second photoresist pattern 225 as a mask, which may form second well 240 which may overlap with a peripheral region of a lower portion of first well 125 and/or may extend to a lower portion of device isolation film 215. In embodiments, extended drain region 230 illustrated in FIG. 2B can be formed by a substantially similar method as an extended drain illustrated in FIG. 1B.

Figure 2C:
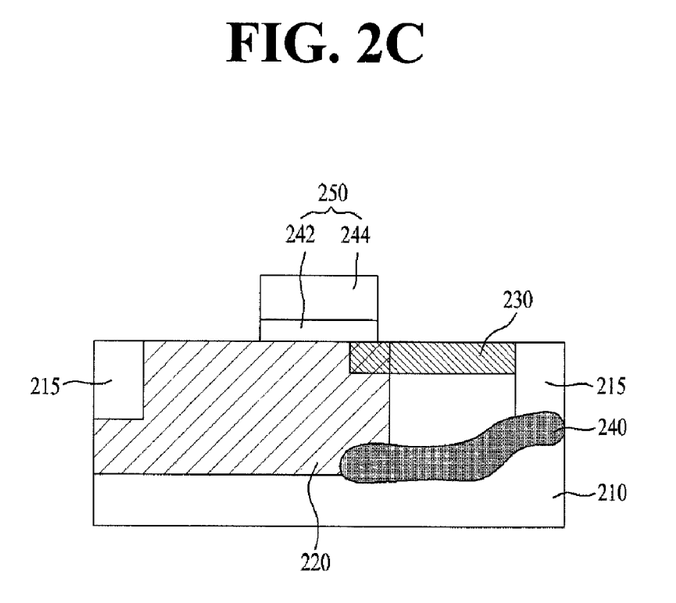
Figure 2D:
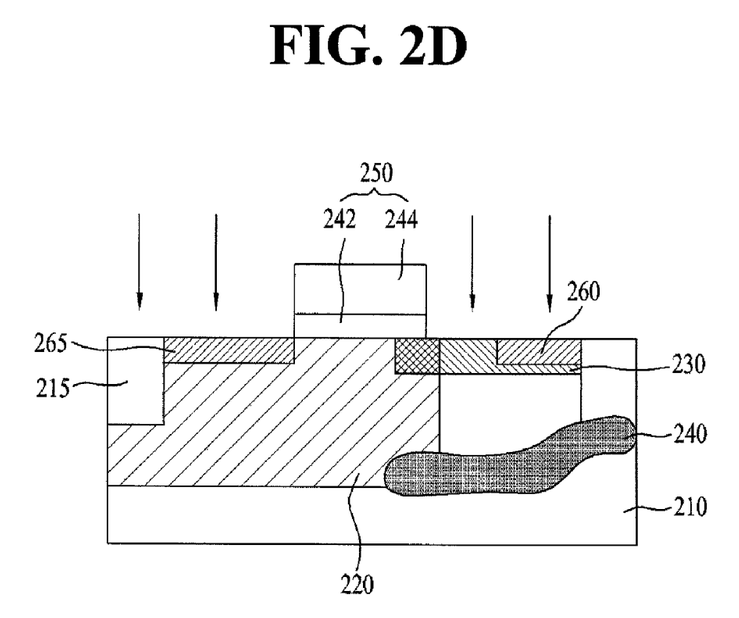

Referring to FIG. 2C, gate 250 may include a stack of gate insulating film 242 and/or gate electrode 244, which may be formed on and/or over first well 220. In embodiments, gate 250 may be formed to position both on and/or over first well 220 and a region where extended drain region 230 and first well 220 may overlap. Referring to FIG. 2D, second conduction type impurities may be injected on and/or over extended drain region 230 at one side of gate 250, which may form drain region 260. In embodiments, second conduction type impurities may be injected on and/or over first well 220 on and/or over another side of gate 250, which may form source region 265. In embodiments, drain region 260 may be formed spaced apart from gate 150, and/or source region 265 may be formed on and/or over first well 220 to be in contact with device isolation film 215 and/or gate 250.

Figure 3A:
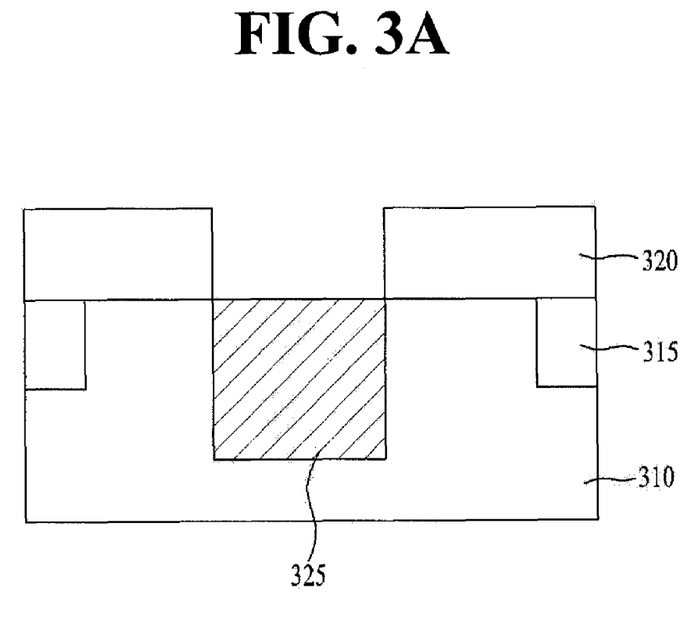
FIG. 3A to 3D are section views illustrating a method of manufacturing a semiconductor device in accordance with embodiments.
Figure 3B:
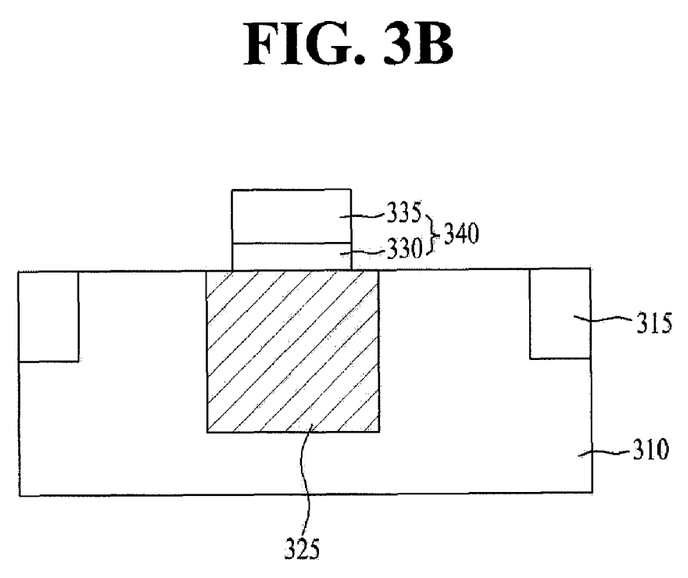

Embodiments relate to a high voltage semiconductor device and methods thereof. Referring to example FIG. 3A to FIG. 3D, section views illustrate a method f manufacturing a semiconductor device in accordance with embodiments. Referring to FIG. 3A, first conduction type well 325 may be formed on and/or over semiconductor substrate 310 which may include device isolation film 315. Referring to FIG. 3B, gate 350 may include a stack of gate insulating film 330 and/or gate electrode 335, which may be formed on and/or over first well 325. In embodiments, gate 350 may be formed to expose opposite peripheral regions of first well 325.

Figure 3C:
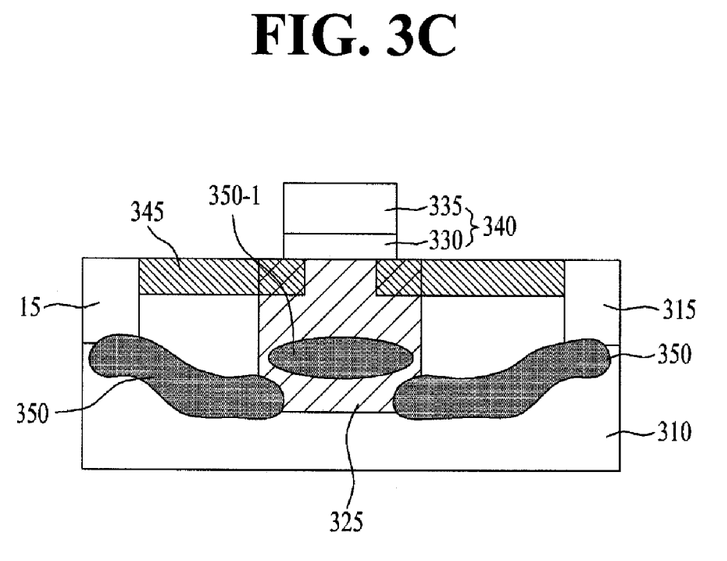

Referring to FIG. 3C, second conduction type impurities may be injected at a concentration between approximately 1E17 atoms/cm$^2$ and 5E 18 atoms/cm$^2$ using gate 350 as a mask, which may form extended drain region 345 overlapped with a region of first well 325. In embodiments, impurities may be injected using the gate 350 as a mask such that self-aligned extended drain region 345 may be formed. In embodiments, extended drain region 345 may be formed to overlap with opposite upper peripheral regions of first well 325. In embodiments, tilted ion injection can be performed to form extended drain region 345 overlapped with opposite upper peripheral regions of first well 325.

According to embodiments, second conduction type impurities may be injected using a gate as a mask, which may form first conduction type second well 350 on and/or over semiconductor substrate 310 under extended drain region 345 to overlap with another region of the first well 325. In embodiments, second well 350 may be formed to overlap with opposite peripheral regions of a lower portion of first well 325 and/or extend to a lower portion of device isolation film 315. In embodiments, second conduction type impurities may pass through gate 340, and/or an additional second well 350-1 may be formed on and/or over a portion of a lower portion of first well 325 opposite gate 340. In embodiments, a step between semiconductor substrate 310 and gate 340 may enable formation of additional second well 350-1 on and/or over region 350-1 of a lower portion of first well 325, for example above second well 350 which may overlap with opposite peripheral regions of a lower portion of first well 325. In embodiments, first well 325 may not be formed as illustrated FIG. 3A, but as illustrated in FIG. 3C. In embodiments, first conduction type second wells 350 and/or 350-1 may be formed on and/or over semiconductor substrate 310 under gate 340 and/or on and/or over semiconductor substrate 310 under extended drain region 345 using a step.

Figure 3D:
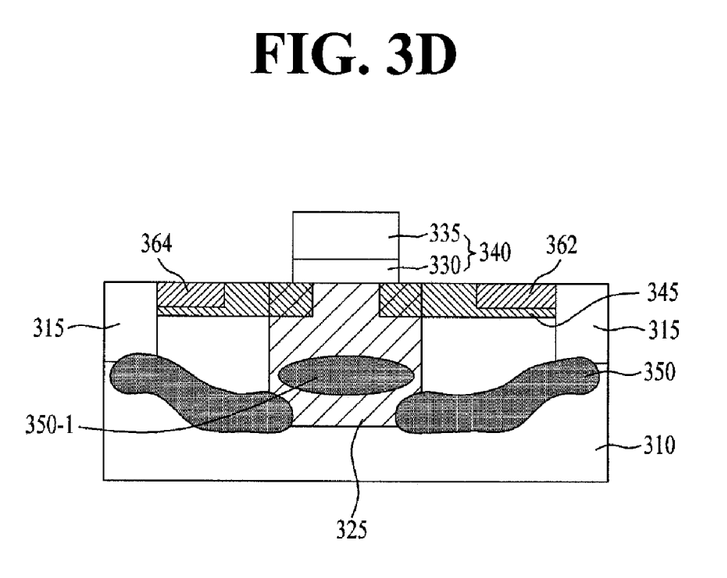

Referring to FIG. 3D, second conduction type impurities may be injected on and/or over extended drain region 345 at one side of gate 340, which may form drain region 362. In embodiments, second conduction type impurities may be injected on and/or over extended drain region 345 at another side of gate 340, which may form source region 364. In embodiments, drain region 345 and/or source region 364 may be formed at substantially the same time using one mask.

Figure 4:
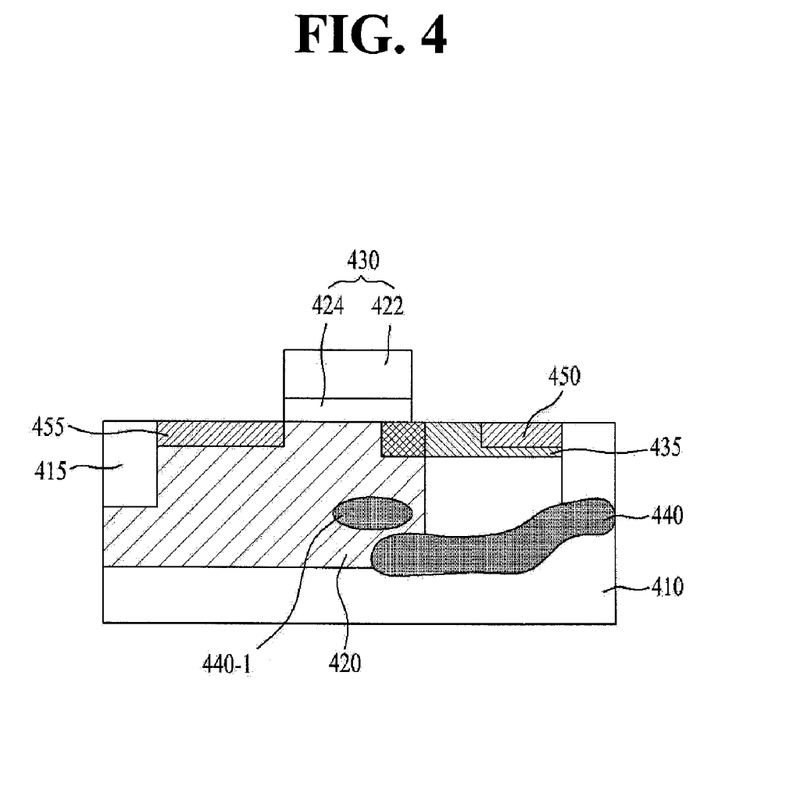
FIG. 4 is a section view of a semiconductor device in accordance with embodiments.

Referring to example FIG. 4, a section of an asymmetric high voltage semiconductor device in accordance embodiments is illustrated. According to embodiments, steps substantially the same as steps performed illustrated in FIG. 3A and FIG. 3B may be performed. In embodiments, in contrast to steps illustrated in FIG. 3C and FIG. 3D, extended drain region 435 may be formed as illustrated in FIG. 4, which may overlap only one side upper peripheral region of first well 420.

According to embodiments, second conduction type impurities may be injected on and/or over semiconductor substrate, which may form second well 440 under extended drain region 435, which may overlap with one side lower peripheral region of first well 420 and/or extend to a lower portion of device isolation film 415. In embodiments, second conduction type impurities may pass gate 430, which may form additional second well 440-1 at a portion of a lower portion of first well 420 opposite gate 430. In embodiments, second conduction type impurities may be injected on and/or over extended drain region 435 at one side of gate 430, which may form drain region 450 spaced apart from gate 150. In embodiments, second conduction type impurities may be injected on and/or over first well 420 at another gate 430, which may form source region 455 in contact with device isolation film 215 and/or gate 250.

Figure 5:
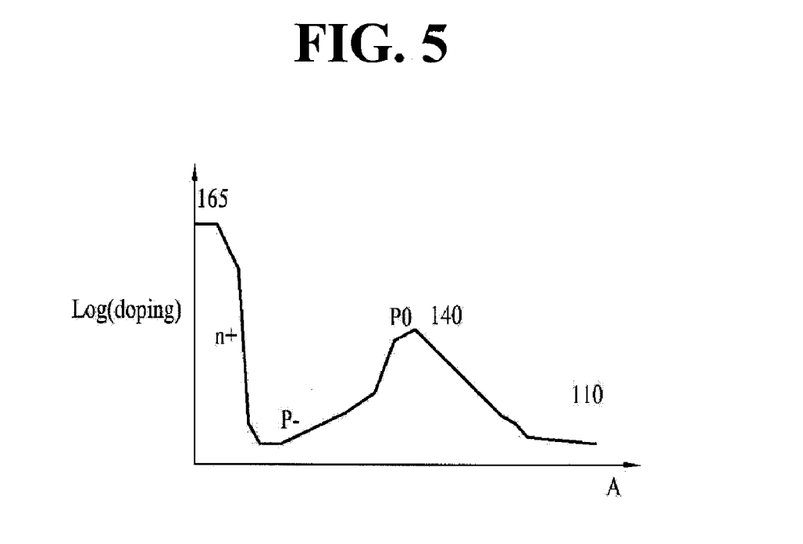
FIG. 5 is a graph illustrating a vertical direction doping profile under a drain region of a semiconductor device in accordance with embodiments.

Referring to example FIG. 5, a graph illustrates a vertical direction of a doping profile under a drain region of a semiconductor device illustrated in FIG. 1D. In embodiments, forming a lightly doped region, for example a semiconductor substrate region, between extended drain region 135 and second well 140 may form a high breakdown voltage region, which may enable insulation between devices.

According to embodiments, a semiconductor device and a method of manufacturing device, including a relatively high voltage device, may include one mask and/or ion injection step. In embodiments, punchthrough between a drain and a source may be minimized, for example by making a size of a relatively high voltage device relatively small. In embodiments, a self-aligned extended drain may be formed using a gate as an ion injection mask.

It will be obvious and apparent to those skilled in the art that various modifications and variations can be made in the embodiments disclosed. Thus, it is intended that the disclosed embodiments cover the obvious and apparent modifications and variations, provided that they are within the scope of the appended claims and their equivalents.

What is claimed is:
1. A method comprising the steps of:
forming a first well by injecting first conduction type impurity ions over a semiconductor substrate;
forming a gate over said first well;
forming an extended drain region overlapped with a portion of said first well by injecting second conduction type impurities using the gate as a mask;
forming a first conduction type second well over said semiconductor substrate under said extended drain and overlapped with another region of said first well by injecting second conduction type impurities using the gate used as a mask; and
forming a drain region by injecting second conduction type impurities over said extended drain region at one side of the gate.

2. The method of claim 1, comprising forming an additional second well over a region of a lower portion of said first well opposite the gate as said second conduction type impurities pass through the gate during forming said first conduction type second well.

3. The method of claim 1, wherein forming said extended drain region comprises forming said extended drain region to overlap with opposite upper peripheral regions of said first well.

4. The method of claim 1, wherein forming said second well comprises forming said second well to overlap with opposite lower peripheral regions of said first well.

5. The method of claim 1, wherein forming said extended drain region comprises forming said extended drain region to overlap with one upper peripheral region of said first well.

6. The method of claim 5, wherein forming said second well comprises forming said second well to overlap with one lower peripheral region of said first well.

7. The method of claim 1, wherein said impurity ions comprise a concentration between approximately 5E16 atoms/cm$^2$ and 5E18 atoms/cm$^2$.

8. A method comprising:
forming a first well by injecting first conduction type impurity ions over a semiconductor substrate;
forming an extended drain region overlapped with a region of said first well by injecting second conduction type impurities over said semiconductor substrate;
forming a first conduction type second well over said semiconductor substrate under said extended drain region and overlapped with another region of said first well by injecting second conduction type impurities over said semiconductor substrate;
forming a gate over said first well overlapped with said extended drain region; and
forming a drain region by injecting second conduction type impurities over said extended drain region at one side of the gate.

9. The method of claim 8, wherein forming said extended drain region comprises forming said extended drain region to overlap with opposite upper peripheral regions of said first well.

10. The method of claim 9, wherein forming said second well comprises forming said second well to overlap with opposite lower peripheral regions of said first well.

11. The method of claim 8, wherein forming said drain region comprises forming said drain region spaced apart from the gate.

12. The method of claim 8, wherein forming said extended drain region comprises forming said extended drain region to overlap with one upper peripheral region of said first well.

13. The method of claim 12, wherein forming said second well comprises forming said second well to overlap one side lower peripheral region of said first well.

14. The method of claim 8, wherein said impurity ions comprise a concentration between approximately 5E16 atoms/cm$^2$ and 5E18 atoms/cm$^2$.

* * * * *